United States Patent [19]

Fieselman et al.

[11] Patent Number: 6,054,720

[45] Date of Patent: Apr. 25, 2000

[54] APPARATUS AND METHOD FOR EVALUATING THE SURFACE INSULATION RESISTANCE OF ELECTRONIC ASSEMBLY MANUFACTURE

[75] Inventors: Charles David Fieselman, Concord; Richard Joseph Noreika, Davidson; Joseph Donald Poole, Troutman, all of N.C.

[73] Assignee: International Business Machines Corporation, Armonk, N.Y.

[21] Appl. No.: 08/965,484

[22] Filed: Nov. 6, 1997

[51] Int. Cl.[7] .............................. H01L 23/58; G01R 29/00
[52] U.S. Cl. ............................ 257/48; 257/778; 361/777; 324/754; 324/158.1; 324/537; 174/261
[58] Field of Search ..................... 257/48, 778; 361/777; 324/754, 158.1, 537; 174/261

[56] References Cited

U.S. PATENT DOCUMENTS

| | | | |
|---|---|---|---|
| 4,360,774 | 11/1982 | Crytzer | 324/54 |
| 4,683,422 | 7/1987 | Goodson | 324/133 |
| 4,697,142 | 9/1987 | Frushour | 324/158 R |
| 4,743,847 | 5/1988 | Frushour | 324/158 R |
| 4,952,871 | 8/1990 | Driller et al. | 324/158 F |
| 5,065,502 | 11/1991 | Amante | 29/620 |
| 5,172,063 | 12/1992 | Munikoti et al. | 324/537 |
| 5,420,756 | 5/1995 | Katsumata et al. | 361/783 |
| 5,457,390 | 10/1995 | Peterson et al. | 324/541 |
| 5,491,424 | 2/1996 | Asar et al. | 324/715 |
| 5,543,633 | 8/1996 | Losavio et al. | 257/48 |
| 5,552,567 | 9/1996 | Petrson et al. | 174/261 |
| 5,754,410 | 5/1998 | Bardsley et al. | 361/777 |
| 5,894,161 | 4/1999 | Akram et al. | 257/48 |

FOREIGN PATENT DOCUMENTS 6 011 530   1/1994   Japan .

OTHER PUBLICATIONS

IBM Technical Disclosure Bulletin, vol. 33, No. 10B, Mar. 1991.

*Primary Examiner*—Leo P. Picard
*Assistant Examiner*—Hung Van Duong
*Attorney, Agent, or Firm*—Pollock, Vande Sande & Amernick

[57] ABSTRACT

A test vehicle for an SIR testing system is described. A circuit board having a plurality of interleaved circuit patterns is provided with replica components mounted thereon. The interleaved circuit patterns have different conductor spacings to permit a qualitative evaluation of electronic assembly manufacturing processes. The replica components have connection leads which are soldered to circuit pads on the circuit board. The circuit pads are connected into two groups which are used along with the interleaved circuit patterns to evaluate the manufacturing process using SIR measurements.

10 Claims, 3 Drawing Sheets

APPARATUS AND METHOD FOR EVALUATING THE SURFACE INSULATION RESISTANCE OF ELECTRONIC ASSEMBLY MANUFACTURE

BACKGROUND OF THE INVENTION

The present invention relates to a technique for measuring the quality of an electronic assembly soldering process. Specifically, a test vehicle is provided which may be used in a surface insulation resistance (SIR) test to evaluate the quality of an electronic assembly soldering process.

The manufacture of electronic circuits includes mounting integrated circuit components onto a single printed circuit board of a module which may be used in a larger electronic system. The circuit board includes conductor patterns which terminate in a connection to either a component, or a connector for making external connections to the circuit board. The process of preparing the board is well known, which can involve a variety of soldering and cleaning techniques. The solder process typically involves the application of flux, solder, and heat to the solderable areas on the circuit board in order to form a soldered connection to components, followed by cleaning to remove unwanted soldering byproducts. The solderable areas include not only connection pads for components, but plated through via holes which extend to the surface of the printed circuit board. The via holes provide a connection between conductors on opposite sides of the printed circuit board.

The soldering techniques typically employed to make external connections to the circuit board include solder paste reflow, wave, fountain, thermode, laser, and hot gas soldering. Subsequent removal of post-soldering byproducts is usually accomplished using aqueous or solvent-based chemistries in a cleaning machine, or without cleaning if no-clean soldering materials are used.

The process of removing the soldering byproducts becomes more difficult as the density of circuit conductors on the circuit board increases, and as the profile or dimensions of the components on the board and the relevant spacing between the components and the board decreases. An incomplete removal of the soldering byproducts has been known to produce latent electrochemical migration or corrosion effects between conductive elements on the assembly. This is particularly acute when a mildly activated resin or organic acid based flux systems are used. The electrochemical migration or corrosion effects may result in latent product reliability problems, such as open circuits caused by corrosion or electrical shorts resulting from electrochemical migration.

One of the techniques which has been developed for evaluating the ability of an electronic assembly process to adequately remove soldering byproducts is known as the surface insulation resistance (SIR) testing technique. The SIR testing methodology has been developed with industry standard specifications controlled by the Electronic Industry Association (EIA) and the Institute for Interconnecting and Packaging Electronic Circuits (IPC). SIR testing employs the use of a special printed circuit board test vehicle which is processed through an electronic assembly manufacturing process. The test vehicle includes four wiring patterns of interleaved conductors which are not normally connected together. The wiring patterns comprise two electrical conductors having a width of 0.016 inches and a spacing of 0.020 inches between the conductors. The test vehicle is subjected to the soldering and cleaning process without any external components or a solder mask which is used in the majority of useable electronic assemblies. Thus, in some ways the standard SIR testing techniques are deficient since the process of removing soldering byproducts from a useable circuit board is effected by the component placement on the printed circuit board.

As new component technology reduces the profile of the various circuit packages which are attached to a printed circuit board, the spacing between the printed circuit board and the components gets smaller, presenting a challenge for removing soldering byproducts which may reside between components and circuit board. Whereas previous component bodies are spaced 0.01 inches from the board surface, facilitating the removal of soldering byproducts which enter the space, the newer components provide a spacing of 0.002 inches which increases the difficulty in removing soldering byproducts which may be trapped beneath the component. This in turn increases the risk for latent electrochemical migration or corrosion which cannot be tested using a test vehicle which does not account for the reduced spacing between the circuit board and components.

The additional improvements in reducing the size of electrical conductors also presents a greater difficulty in evaluating the potential for electrochemical migration or corrosion. Whereas the previous test vehicles used a conductor width of approximately 0.016 inches and conductor spacings of 0.020 inches, newer printed circuit designs allow for a conductor spacing of 0.006 inches versus the previous 0.020 inch conductor spacing.

Given the foregoing improvements in electronic assembly density, a better test vehicle is needed for evaluating the soldering and cleaning processes in this new high density environment.

BRIEF SUMMARY OF THE INVENTION

It is an object of this invention to provide a SIR test vehicle for evaluating printed circuit manufacturing processes for electronic assemblies.

This and other objects of the invention are provided for by a printed circuit board which supports a plurality of interleaved circuit patterns. The interleaved circuit patterns have a pair of spaced apart conductors which terminate on a via hole on the circuit board. The via holes on the circuit board are connected by a conductor within the hole to a conductor on the underside of the circuit board. A replica component having the dimensions and lead configurations of an actual component is supported on the circuit board over at least one of the interleaved patterns. The test vehicle with the replica component is subjected to the manufacturing process through which actual circuit board assemblies are to be fabricated. The interleaved circuit patterns provide an ability to measure the effects of electrochemical migration or corrosion which occurs as a result of unwanted soldering byproducts being incompletely removed from the circuit board surface. The replica components are supported above the circuit board at distances which are contemplated for actual components which are to be used on circuit boards. The effects of soldering byproducts which remain on the electronic assembly, and particularly soldering byproducts which reside between the replica component and the circuit board, may be determined by measuring the resistance between the interleaved conductors of the circuit pattern.

In a preferred embodiment of the invention, not only is the resistance between the interleaved circuit patterns measured as an indicator of the manufacturing cleaning process effectiveness, but the replica circuit component connections to the circuit board are divided into two groups, and resistance measurements are made between groups of connections as an indication of the potential for electrochemical migration or corrosion effects.

DESCRIPTION OF THE PREFERRED EMBODIMENT

Figure 1:
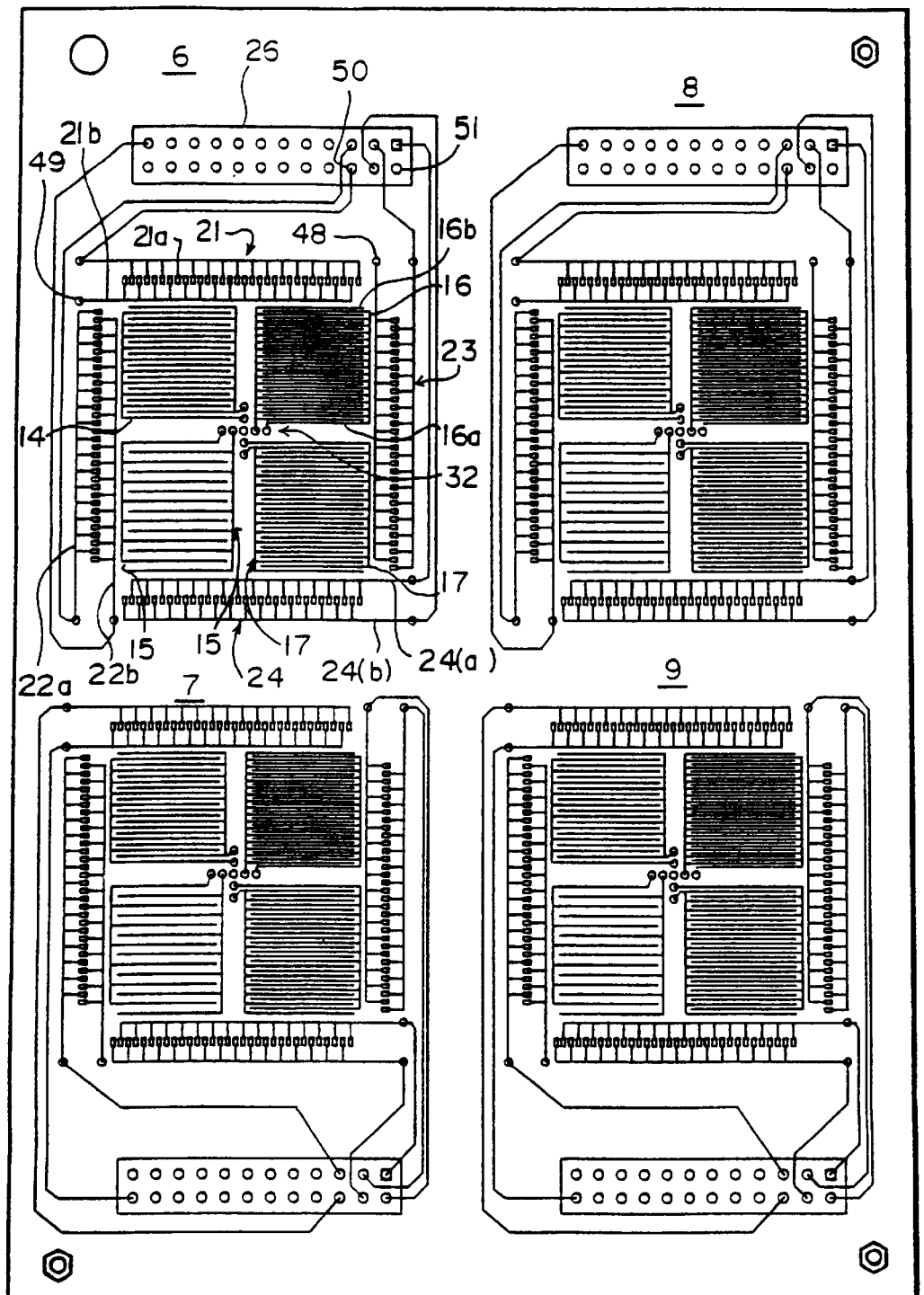
FIG. 1 is a plan view of a test vehicle for making SIR measurements before component placement.
Figure 2:
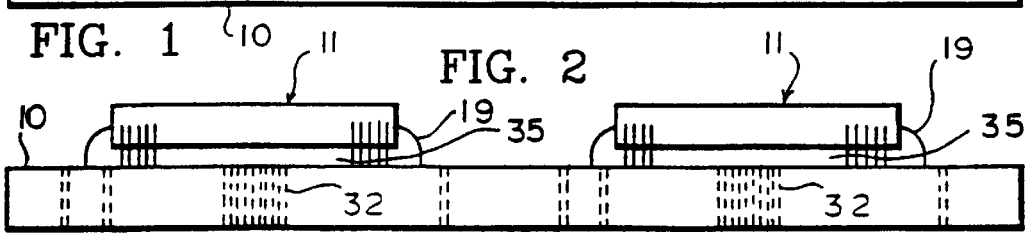
FIG. 2 is a side view of FIG. 1 showing component placement on the circuit as board.

Referring now to FIG. 1, a plan view of a test vehicle circuit board 10 is illustrated. The circuit board 10 is divided into four quadrants 6, 7, 8 and 9 having identical interleaved circuit conductor patterns and connector configurations. The circuit board of FIG. 1 is intended to include four surface mounted replica components 11 (shown only in FIG. 2) which approximate the actual component configuration which will be on printed circuit boards being assembled in a tested soldering and cleaning process. It is contemplated that the test vehicle 10 of FIGS. 1 and 2 will support replicas of state of the art integrated circuit packages, such as a TQFP package having a height of 0.055 inches. These packages include between 32 and 256 connection leads about the circumference of the package. The minimum spacing of the leads is approximately 0.005 inches. The footprint offered by the foregoing TQFP package is approximately 0.079 inches, and when mounted on a quadrant 6, 7, 8 and 9 of the circuit board 10, substantially covers four interleaved circuit patterns 14, 15, 16 and 17. The leads 19 around the circumference of the package connect to four sets of circuit board pads 21, 22, 23 and 24 placed around the circumference of circuit patterns 14 through 17. In the embodiments shown, 128 connection leads are connected to circuit board solder pads of sets 21 through 24.

Each of the quadrants 6 through 9 of the printed circuit board 10 supports an identical replica component 11 having the same number of leads supported on the same number of circuit pads. Each of the individual quadrants 6 through 9 provide for separate tests of surface insulation resistance once the test vehicle comprising circuit board 10 and mounted replica components 11 have been put through an electronic assembly manufacturing process.

The individual quadrants 6 through 9 of the circuit board 10 have a plurality of via holes 32 which form terminations for a pair of conductors of each of the interleaved circuit patterns 14 through 17. Each of the ends of the conductors for the circuit patterns 14 through 17 are connected to a via hole 36 through 43, where they are connected to conductors running on the other side of the circuit board 10 to terminals of connector 26 as will be evident from the discussion of FIG. 4. The significance of the location of the set of via holes 32 is to simulate a circuit board hole pattern which results in flux used in the soldering process entering the space 35 between the replica components 11 and circuit board 10. Space 35 containing the circuit patterns 14 through 17 represent a challenge for the manufacturing process to effectively remove flux residue or soldering byproducts which may have migrated into the space 35 through the via holes 32 as well as laterally around the component leads 19.

The space 35 may be as small as 0.002 inches using the TQFP circuit packages.

Figure 3:
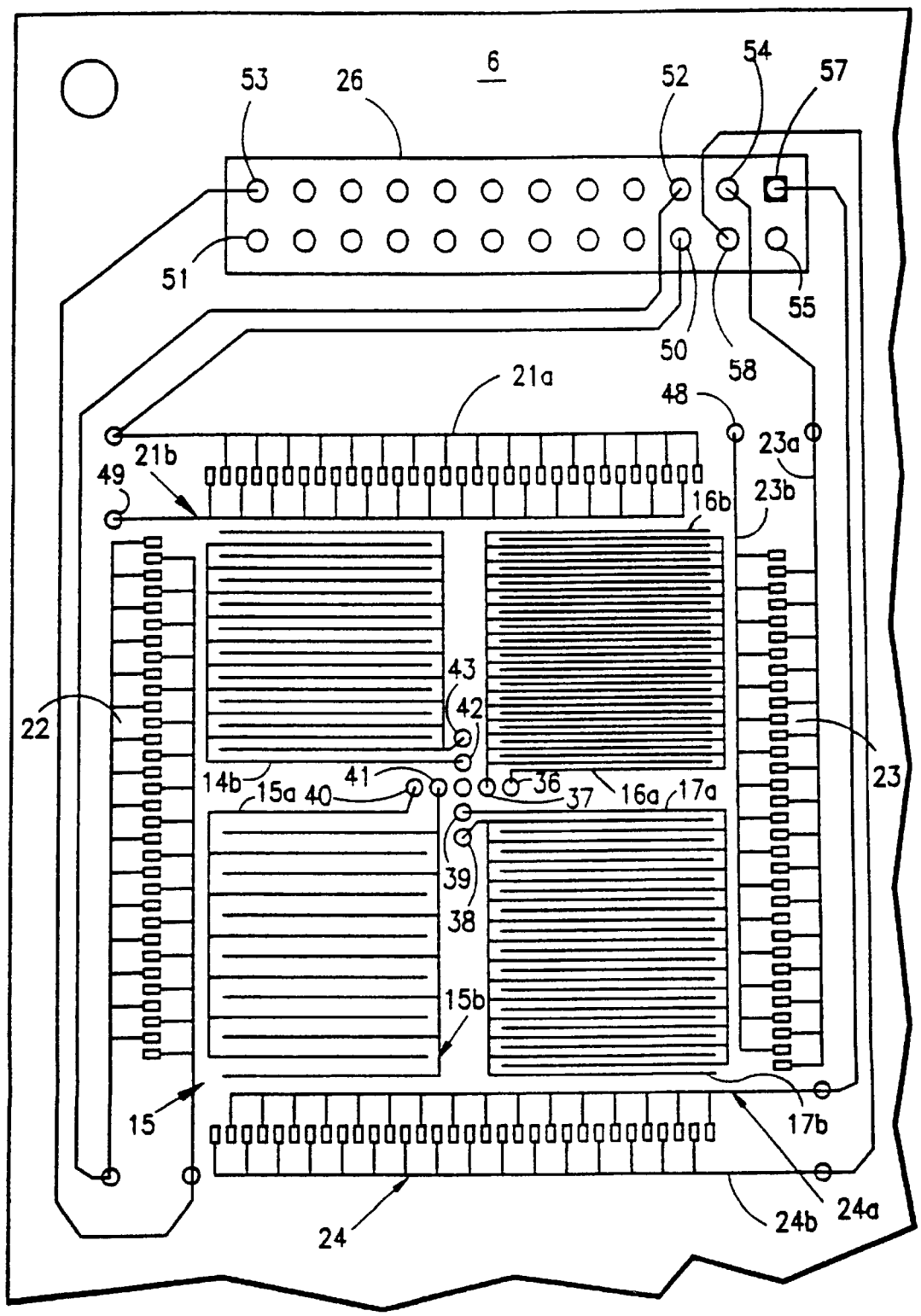
FIG. 3 is a top view of one quadrant of the circuit board constituting the test vehicle.

FIG. 3 illustrates on a larger scale an individual quadrant 6 of the test vehicle of FIG. 1. Each of the circuit patterns 14 through 17 is an interleaved pattern of two conductors, and the spacing between the interleaved patterns is different for each pattern. By having differently spaced interleaved patterns on the circuit board, it is possible to quantify the manufacturing process performance as it relates to electrochemical migration or corrosion.

The conductors 14a, 14b, 15a, 15b, 16a, 16b, 17a and 17b simulate the circuit conductor of the printed circuit boards used in state of the art manufacturing processes. The spacing, between conductors of each interleaved circuit pattern may be, for example, 0.006 inches, 0.012 inches, 0.019 inches, and 0.032 inches.

Each of the circuit pads sets 21 through 24 comprise individual circuit pads which are grouped into two groups 21(a), 21(b), 22(a), 22(b), 23(a), 23(b) and 24(a) and 24(b). Group (a) and (b) are connected to alternate circuit pads, and to individual terminals of the connector 26. For instance group 21(a) connects to terminal 50 and group 21(b) connects to terminal 51 through the via hole 49 and conductor 44. Groups 22(a) and 22(b) are connected to terminals 52 and 53, groups 23(a) and 23(b) are connected to terminals 54, 55 and groups 24(a) and 24(b) are connected to terminals 57, 58.

Similar connections are provided for circuit pad sets 22, 23 and 24, with each of these sets of circuit pads divided into two groups, and each group connected to a respective terminal of the connector 26. Any type of connector may be substituted for the connectors 26 shown. For example, a series of printed conductive pads at the edge of the board may be used so the board can fit into a slot.

Figure 4:
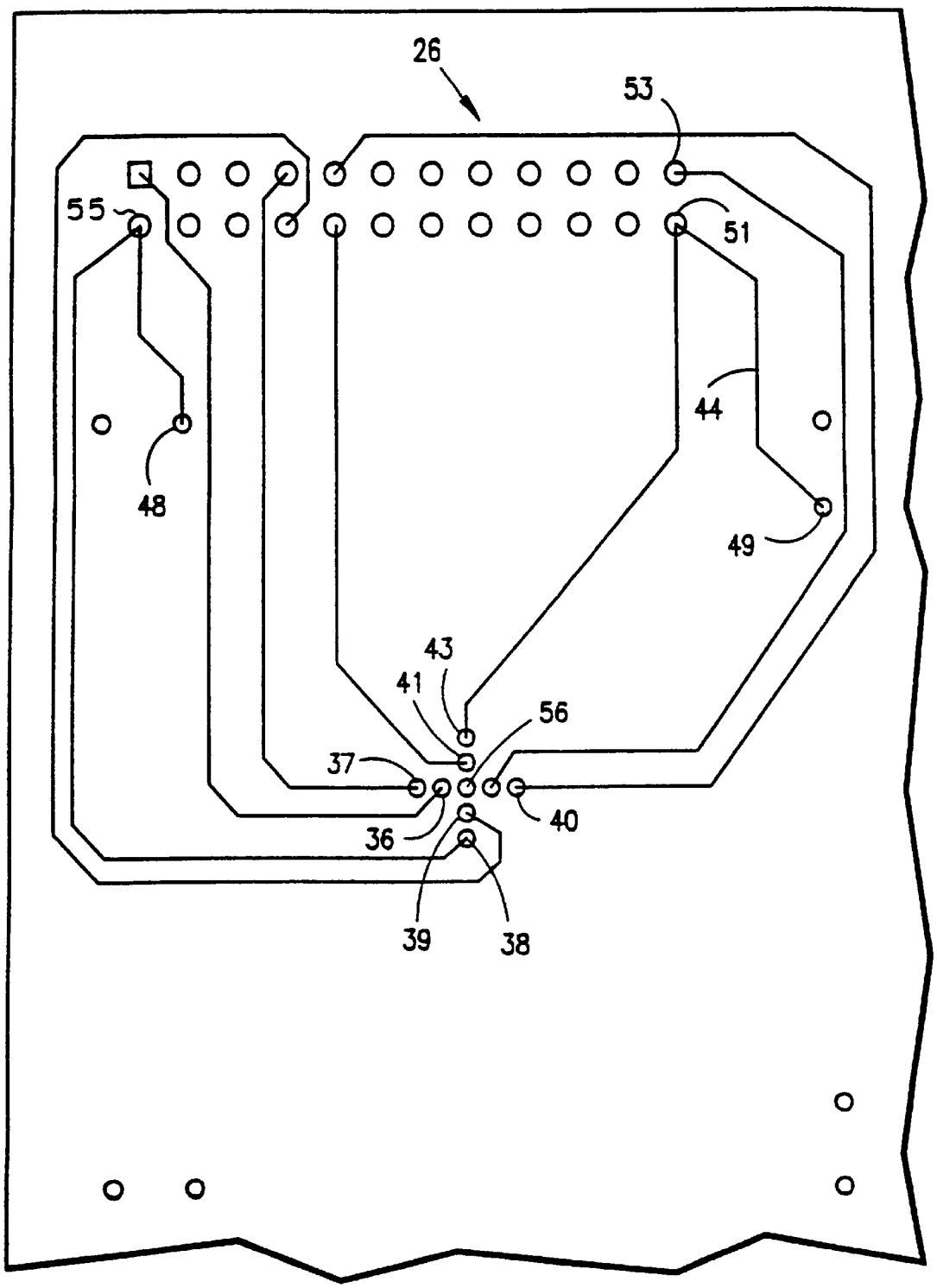
FIG. 4 is a bottom view of the circuit board quadrant of FIG. 3.

FIG. 4 shows how the via holes 36 through 42 and 48 and 49 are connected to respective terminals of connector 26 at the edge of the board. A central via hole 56 is left unconnected. This via hole presents a worst case flux or soldering byproduct residue N2 removal scenario since it resides under the center of replica component 11.

The test vehicle in accordance with the preferred embodiment is run through an actual manufacturing process for soldering the components 11 to the boards, including a fluxing operation, a soldering operation, and a subsequent cleaning operation to remove soldering byproducts from the electronic assembly. The quality of each of these processes is reflected in the measured resistance between each of the conductors of circuit patterns 14 through 17, as well as the resistance between two groups of each of the sets of component pads 21, 22 and 23. Following the manufacturing processes, these resistance values are measured at the connector 26, and an evaluation of the manufacturing process is made. For instance, soldering byproducts which have migrated underneath the replica components 11 which were not removed during cleaning, may produce corrosion and/or electrochemical migration, affecting the resistance measurements of circuit patterns 14 through 17. The four quadrants 6 through 9 of the test vehicle provide the capability of independent SIR measurements. The combination of replica components 11, circuit board conductor patterns 14 through 17, and their relative position with respect to the via holes provide a rigorous evaluation of the soldering and cleaning process for increased circuit densities.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A test vehicle for an electronic assembly manufacturing process comprising:

a printed circuit board supporting one or more test patterns, each test pattern including at least one interleaved circuit pattern, said interleaved circuit pattern having a first and second spaced apart conductors having ends which connect to a connector on said circuit board; and a replica component supported on said circuit board over said one or more test patterns, said interleaved circuit pattern providing an electrical resistance measured through said connector which varies in accordance with the quality of a manufacturing process for said test vehicle.

2. The test vehicle according to claim 1 wherein a plurality of said interleaved circuit patterns is provided on said circuit board having different spacings between said spaced apart conductors.

3. The test vehicle according to claim 2 wherein each of said interleaved circuit patterns have first and second ends connected to individual via holes in said circuit board.

4. The test vehicle according to claim 1 wherein said replica component includes a plurality of leads which are connected to a plurality of circuit pads on said circuit board.

5. The test vehicle according to claim 4 wherein said circuit pads are divided into two groups, each pad of a group being connected in common, the resistance between each of said groups being an indication of the quality of said manufacturing process.

6. The test vehicle according to claim 5 wherein said two groups comprise alternate of said circuit pads.

7. A test vehicle for an electronic assembly manufacturing process comprising:

a circuit board having a plurality of interleaved circuit patterns, each of said circuit patterns including first and second conductors which are spaced apart and have first and second ends which are connected through at least one via hole to a connector on said circuit board;

a replica component having leads for connection to a plurality of circuit pads on said circuit board during said manufacturing process, said replica components covering at least a portion of said circuit patterns and at least one via hole, whereby a resistance between said first and second conductors indicates the effects of said manufacturing process on the circuit patterns formed under said replica component.

8. The test vehicle according to claim 7 wherein said circuit patterns each have a different spacing between said first and second conductors.

9. The test vehicle according to claim 7 wherein said first and second conductors first and second ends terminate on a different via hole.

10. The test vehicle according to claim 7 wherein said circuit pads are connected in two groups so that the resistance between each of said groups may be measured as an indication of said effects of said manufacturing process.

* * * * *